US012635203B2

(12) United States Patent
Uchida

(10) Patent No.: US 12,635,203 B2
(45) Date of Patent: May 19, 2026

(54) SILICON CARBIDE SEMICONDUCTOR DEVICE

(71) Applicant: SUMITOMO ELECTRIC INDUSTRIES, LTD., Osaka (JP)

(72) Inventor: Kosuke Uchida, Osaka (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 375 days.

(21) Appl. No.: 18/681,214

(22) PCT Filed: Jun. 23, 2022

(86) PCT No.: PCT/JP2022/025185
§ 371 (c)(1),
(2) Date: Feb. 5, 2024

(87) PCT Pub. No.: WO2023/062883
PCT Pub. Date: Apr. 20, 2023

(65) Prior Publication Data
US 2024/0313058 A1     Sep. 19, 2024

(30) Foreign Application Priority Data
Oct. 13, 2021     (JP) ................................. 2021-168094

(51) Int. Cl.
*H01L 29/16* (2006.01)
*H01L 29/78* (2006.01)
(Continued)

(52) U.S. Cl.
CPC ....... *H10D 62/8325* (2025.01); *H10D 30/665* (2025.01)

(58) Field of Classification Search
CPC .. H10D 62/8325; H10D 62/832; H10D 62/10; H10D 30/665; H10D 30/66;
(Continued)

(56) References Cited

U.S. PATENT DOCUMENTS 12,501,650 B2 * 12/2025 Okuno ................. H10D 30/665
2012/0061688 A1 * 3/2012 Watanabe .......... H10D 62/8325
257/77
(Continued)

FOREIGN PATENT DOCUMENTS

JP     2017-079225     4/2017
JP     2019-050320     3/2019
(Continued)

OTHER PUBLICATIONS

Dr. Nicolae-Cristian Sintamarean, "Infineon-Automotive MOSFETs Current-Handling in Power-Applications" V1.0 May 2015, Published by Infineon Technologies AG,81726 Munich, Germany.

*Primary Examiner* — Nikolay K Yushin
(74) *Attorney, Agent, or Firm* — IPUSA, PLLC

(57) ABSTRACT

A silicon carbide semiconductor device includes a first passivation film formed on gate and source pads on a principal surface of a silicon carbide substrate, and a second passivation film formed on the first passivation film. The first passivation film includes a first interlayer insulation between the gate and source pads, a first opening exposing the gate pad and having a first edge, and a second opening exposing the source pad and having a second edge. First and second plating film are formed on the gate and source pads inside the first and second openings, respectively. The second passivation film is also formed on the first and second plating films, and includes a second interlayer insulation covering the first interlayer insulation, a third opening exposing the first plating film and having a third edge, and a fourth opening exposing the second plating film and having a fourth edge.

8 Claims, 6 Drawing Sheets

(51) Int. Cl.
    *H10D 30/66*       (2025.01)
    *H10D 62/832*     (2025.01)

(58) Field of Classification Search
    CPC ...... H10D 30/60; H10D 30/40; H10D 30/021;
                                     H10D 30/01
    See application file for complete search history.

(56)                  References Cited

U.S. PATENT DOCUMENTS

| | | |
|---|---|---|
| 2017/0110544 A1 | 4/2017 | Hoshi et al. |
| 2017/0221998 A1* | 8/2017 | Ebihara .................... H10D 8/60 |
| 2019/0080976 A1 | 3/2019 | Kudou et al. |
| 2021/0028085 A1 | 1/2021 | Okura |
| 2021/0234007 A1* | 7/2021 | Ueno ....................... H10D 8/60 |
| 2021/0376142 A1* | 12/2021 | Nakamura ........... H10D 84/148 |
| 2022/0181447 A1* | 6/2022 | Nagata ............... H10D 62/8325 |
| 2023/0034063 A1* | 2/2023 | Okuno ................ H10D 30/665 |
| 2023/0387291 A1* | 11/2023 | Hoshi ................. H10D 30/665 |

FOREIGN PATENT DOCUMENTS

| | | |
|---|---|---|
| JP | 2019-201160 | 11/2019 |
| JP | 2020-077756 | 5/2020 |
| JP | 2021-093496 | 6/2021 |

\* cited by examiner

100

220
6
7
225
215
122

112

II

II

III

III 214 224

SILICON CARBIDE SEMICONDUCTOR DEVICE

TECHNICAL FIELD

The present disclosure relates to silicon carbide semiconductor devices.

This application is based upon and claims priority to Japanese Patent Application No. 2021-168094, filed on Oct. 13, 2021, the entire contents of which are incorporated herein by reference.

BACKGROUND ART

A silicon carbide semiconductor device, having a metal plate connected to a source pad of a semiconductor chip using solder, has been proposed as a silicon carbide semiconductor device used for a power module. In a case where a gate pad is provided near the source pad, a passivation film is provided so that the solder provided on the source pad does not reach the gate pad when the solder melts.

PRIOR ART DOCUMENTS

Non-Patent Documents

Non-Patent Document 1: Infineon-Automotive MOSFETs Current-Handling in Power-Applications

DISCLOSURE OF THE INVENTION

A silicon carbide semiconductor device according to the present disclosure includes: a silicon carbide substrate having a first principal surface; a gate pad and a source pad formed on the first principal surface; a first passivation film formed on the gate pad and the source pad; and a second passivation film formed on the first passivation film, the first passivation film including: a first interlayer insulation between the gate pad and the source pad; a first opening exposing the gate pad and having a first edge; and a second opening exposing the source pad and having a second edge, the silicon carbide semiconductor device further including: a first plating film formed on the gate pad inside the first opening; and a second plating film formed on the source pad inside the second opening, the second passivation film is also formed on the first plating film and the second plating film, the second passivation film including: a second interlayer insulation covering the first interlayer insulation; a third opening exposing the first plating film and having a third edge; and a fourth opening exposing the second plating film and having a fourth edge, wherein in a plan view viewed in a direction perpendicular to the first principal surface, the first edge is outside the third edge, and the second edge is outside the fourth edge.

MODE OF CARRYING OUT THE INVENTION

Figure 1:
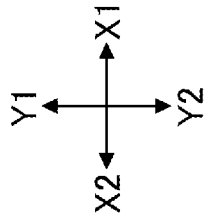
FIG. 1 is a top view illustrating a silicon carbide semiconductor device according to an embodiment.

Problem to be Solved by the Present Disclosure

In a conventional silicon carbide semiconductor device, migration may occur at the source pad when a large current flows and the amount of generated heat increases, such as during a short-circuit operation or the like.

One object of the present disclosure is to provide a silicon carbide semiconductor device capable of reducing migration of a source pad caused by generated heat.

Effects of the Present Disclosure

According to the present disclosure, migration of the source pad caused by generated heat can be reduced.

Embodiments of the present disclosure will be described below.

DESCRIPTION OF EMBODIMENTS OF THE PRESENT DISCLOSURE

First, the embodiments of the present disclosure will be described below. In the following description, the same or corresponding elements are designated by the same reference numerals, and the same description thereof will not be repeated. In a crystallographic description in the present specification, an individual orientation is represented by [ ], a group orientation is represented by < >, an individual plane is represented by ( ), and a group plane is represented by { }. In addition, a negative crystallographic index is generally represented by "−" (bar) above the numeral, but in the present specification, a negative sign is added before the numeral. In the present specification and the drawings, X1-X2 direction, Y1-Y2 direction, and Z1-Z2 direction are directions that are perpendicular to one another. A plane including the X1-X2 direction and the Y1-Y2 direction is referred to as an XY-plane, a plane including the Y1-Y2 direction and the Z1-Z2 direction is referred to as a YZ-plane, and a plane including the Z1-Z2 direction and the X1-X2 direction is referred to as a ZX-plane. For the sake of convenience, the Z1-Z2 direction is defined as a up-down direction, a Z1-side is defined as an upper side, and a Z2-side is defined as a lower side. Further, a plan view of an object refers to a view of the object viewed from the Z1-side, and a planar shape of the object refers to a shape of the object in the plan view viewed from the Z1-side.

[1] A silicon carbide semiconductor device according to one aspect of the present disclosure includes a silicon carbide substrate having a first principal surface; a gate pad and a source pad formed on the first principal surface; a first passivation film formed on the gate pad and the source pad; and a second passivation film formed on the first passivation film, the first passivation film including a first interlayer insulation between the gate pad and the source pad; a first opening exposing the gate pad and having a first edge; and a second opening exposing the source pad and having a second edge, the silicon carbide semiconductor device further including a first plating film formed on the gate pad inside the first opening; and a second plating film formed on the source pad inside the second opening, the second passivation film is also formed on the first plating film and the second plating film, the second passivation film including a second interlayer insulation covering the first interlayer insulation; a third opening exposing the first plating film and having a third edge; and a fourth opening exposing the second plating film and having a fourth edge, wherein in a plan view viewed in a direction perpendicular to the first principal surface, the first edge is outside the third edge, and the second edge is outside the fourth edge.

In the plan view viewed in the direction perpendicular to the first principal surface, the first edge is located outside the third edge, and the second edge is located outside the fourth edge. For this reason, even if the first plating film and the second plating film are formed wide in a plane parallel to the first principal surface, melted solder is less likely to reach the gate pad when a metal plate is connected to the source pad using the solder. Accordingly, it is possible to reduce an electrical connection between the source pad and the gate pad through the solder. Thus, heat is easily released from the silicon carbide substrate in a direction in which the first principal surface is located, through the first plating film and the second plating film, and migration of the source pad caused by generated heat can be reduced.

[2] In the silicon carbide semiconductor device according to [1], in the plan view viewed in the direction perpendicular to the first principal surface, a first distance between a first end of the source pad nearest to the gate pad and the second edge may be less than or equal to 80% of a second distance between the first end and the fourth edge. In this case, the second plating film can easily be formed wide, and the migration of the source pad caused by the generated heat can easily be reduced.

[3] In the silicon carbide semiconductor device according to [2], the first distance may be less than or equal to 60% of the second distance. In this case, the migration of the source pad caused by the generated heat can more easily be reduced.

[4] In the silicon carbide semiconductor device according to [3], the first distance may be less than or equal to 40% of the second distance. In this case, the migration of the source pad caused by the heat can even more easily be reduced.

[5] In the silicon carbide semiconductor device according to any one of [1] to [4], in the plan view viewed in the direction perpendicular to the first principal surface, a first distance between a first end of the source pad nearest to the gate pad and the second edge may be less than or equal to 30 μm. In this case, the second plating film can easily be formed wide, and the migration of the source pad caused by the generated heat can easily be reduced.

[6] In the silicon carbide semiconductor device according to any one of [1] to [5], the silicon carbide substrate may include an active region including a plurality of unit cells, and a termination region provided in a perimeter around the active region, and in the plan view viewed in the direction perpendicular to the first principal surface, the second edge may be separated from the plurality of unit cells. In this case, heat generated in each unit cell is easily transferred to the source pad, and heat is less likely to be trapped inside the silicon carbide semiconductor device, so that the migration of the source pad caused by the generated heat can easily be reduced.

[7] In the silicon carbide semiconductor device according to any one of [1] to [6], the silicon carbide substrate may include an active region including a plurality of unit cells, and a termination region provided in a perimeter around the active region, and the termination region may be covered with both the first passivation film and the second passivation film. In this case, the termination region has an excellent moisture resistance, thereby making it possible to obtain an excellent reliability.

[8] In the silicon carbide semiconductor device according to any one of [1] to [7], the first passivation film may be an inorganic film, and the second passivation film may be an organic film. In this case, an excellent moisture resistance can be obtained by the first passivation film, and an excellent flexibility can be obtained by the second passivation film.

DETAILS OF EMBODIMENTS OF THE PRESENT DISCLOSURE

Figure 2:
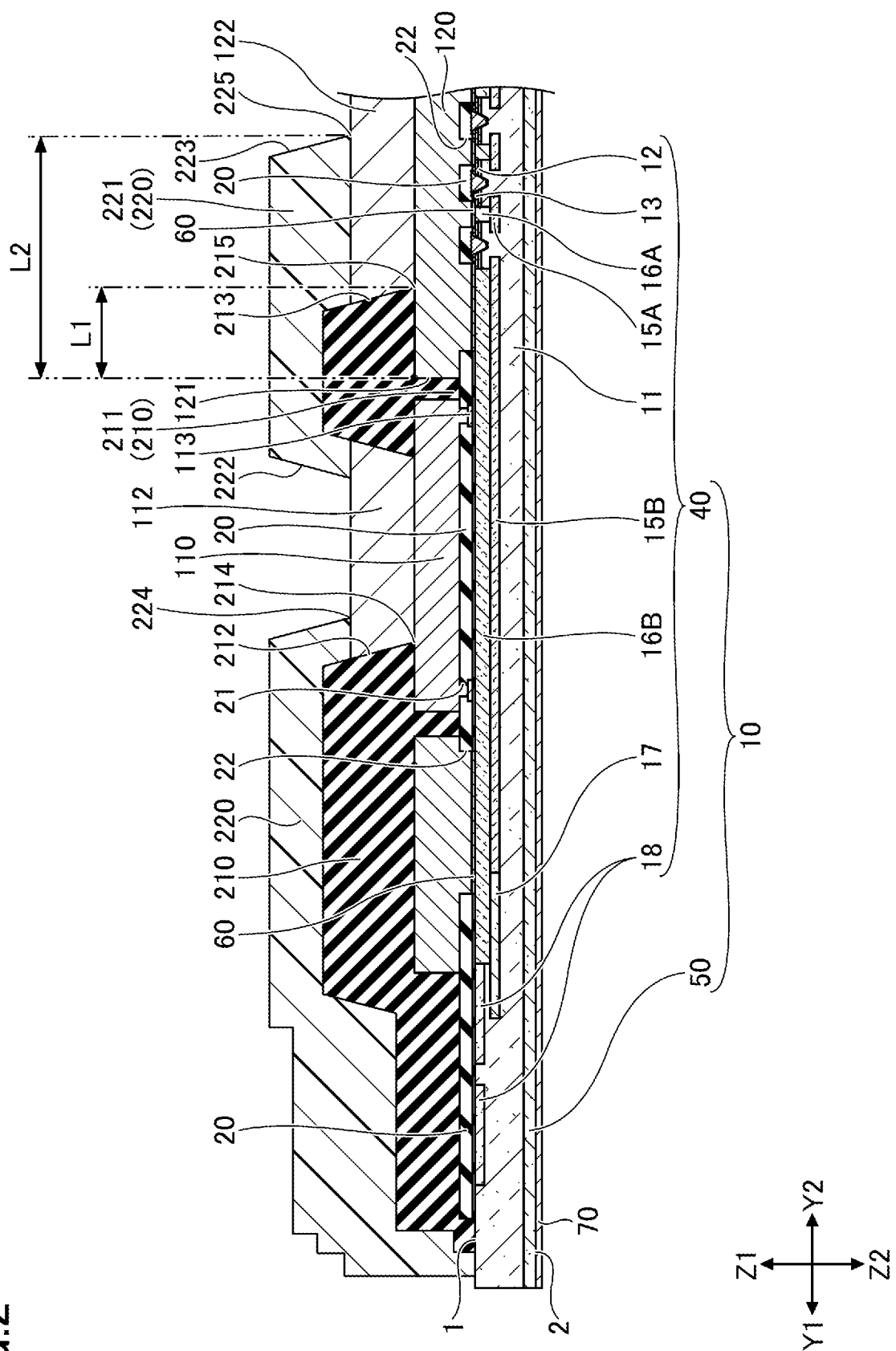
FIG. 2 is a cross sectional view (part 1) illustrating the silicon carbide semiconductor device according to the embodiment.
Figure 3:
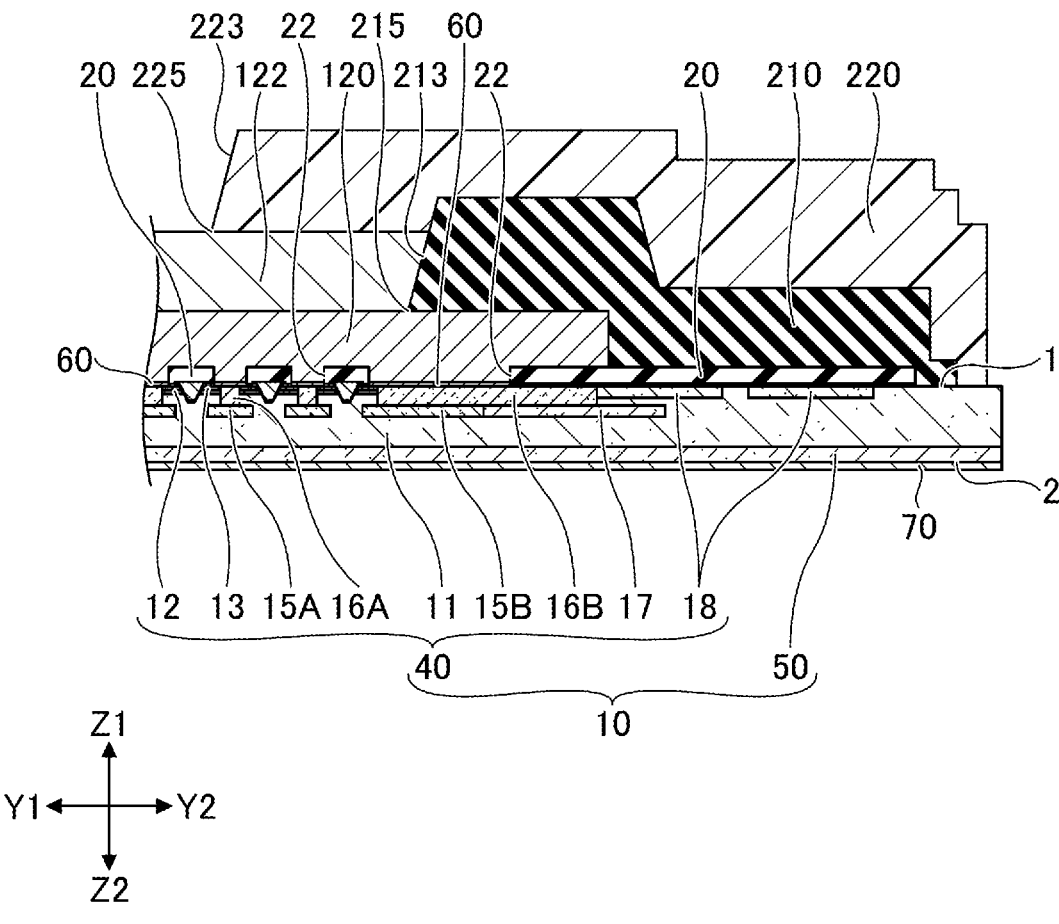
FIG. 3 is a cross sectional view (part 2) illustrating the silicon carbide semiconductor device according to the embodiment.
Figure 4:
FIG. 4 is a cross sectional view illustrating a structure of a unit cell.
Figure 4:
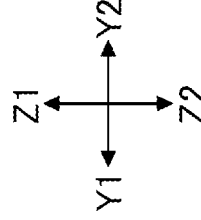

Embodiments of the present disclosure relate to a so-called vertical MOSFET (silicon carbide semiconductor device). FIG. 1 is a top view illustrating a silicon carbide semiconductor device according to an embodiment. FIG. 2 and FIG. 3 are cross sectional views illustrating the silicon carbide semiconductor device according to the embodiment. FIG. 2 corresponds to a cross sectional view taken along a line II-II in FIG. 1. FIG. 3 corresponds to a cross sectional view taken along a line III-III in FIG. 1. FIG. 4 is a cross sectional view illustrating a structure of a unit cell.

As illustrated in FIG. 1 through FIG. 4, a silicon carbide semiconductor device 100 according to the present embodiment may mainly include a silicon carbide substrate 10, a gate insulating film 81, a gate electrode 82, a source electrode 60, a drain electrode 70, an interlayer insulator film 20, a first passivation film 210, a second passivation film 220, a gate pad 110, a first plating film 112, a source pad 120, and a second plating film 122.

The silicon carbide substrate 10 includes a silicon carbide single crystal substrate 50, and a silicon carbide epitaxial layer 40 provided on the silicon carbide single crystal substrate 50. The silicon carbide substrate 10 has a first principal surface 1, and a second principal surface 2 opposite to the first principal surface 1. The silicon carbide epitaxial layer 40 forms the first principal surface 1, and the silicon carbide single crystal substrate 50 forms the second principal surface 2. The silicon carbide single crystal substrate 50 and the silicon carbide epitaxial layer 40 are composed of hexagonal silicon carbide of polytype 4H, for example. The silicon carbide single crystal substrate 50 includes an n-type impurity, such as nitrogen (N) or the like, for example, and has an n-type conductivity (first conductivity type). A semiconductor element is formed on the silicon carbide substrate 10.

The first principal surface 1 is a {0001} plane or a plane inclined from the {0001} plane by an off angle of 8° or less in an off direction. Preferably, the first principal surface 1 is a (000-1) plane or a plane inclined from the (000-1) plane by an off angle of 8° or less in the off direction. The off direction may be a <11-20> direction, or a <1-100> direction, for example. The off angle may be 1° or greater, or 2° or greater, for example. The off angle may be 6° or less, or 4° or less.

The silicon carbide semiconductor device 100 has an active region 6, and a termination region 7 provided in a perimeter around the active region 6 in the plan view viewed in the direction perpendicular to first principal surface 1. The active region 6 is a region in which a plurality of unit cells 8 are arranged. The unit cells 8 have the X1-X2 direction as a longitudinal direction thereof, and are arranged side by side in the Y1-Y2 direction. The unit cells 8 have the same size in the Y1-Y2 direction. Each unit cell 8 has a pair of gate trench 5 and gate electrode 82. The unit cells 8 are arranged side by side at a constant pitch in the Y1-Y2 direction.

In the present embodiment, a field effect transistor is formed as an example of the semiconductor element on the silicon carbide substrate 10. The silicon carbide epitaxial layer 40 may mainly include a drift region 11, a body region 12, a source region 13, a first buried region 15A, a second buried region 15B, a first contact region 16A, a second contact region 16B, a buried junction termination extension (JTE) region 17, and a surface JTE region 18. The body region 12, the source region 13, the first buried region 15A, and the first contact region 16A are provided in the active region 6. The buried JTE region 17 and the surface JTE region 18 are provided in the termination region 7. The drift region 11 is provided on the active region 6 and the entire termination region 7 throughout entireties thereof. The second buried region 15B and the second contact region 16B are provided on a part of the active region 6 and a part of the termination region 7.

The drift region 11 includes an n-type impurity, such as nitrogen, or phosphorus (P), or the like, for example, and has the n-type conductivity. Addition of the n-type impurity to the drift region 11 is preferably performed by impurity addition during epitaxial growth of the drift region 11, and not by ion implantation.

The body region 12 is provided on the drift region 11. The body region 12 includes a p-type impurity, such as aluminum (Al) or the like, for example, and has a p-type conductivity (second conductivity type).

The source region 13 is provided on the body region 12, so as to be separated from drift region 11 by body region 12. The source region 13 includes an n-type impurity, such as nitrogen, or phosphorus, or the like, for example, and has the n-type conductivity. The source region 13 forms the first principal surface 1.

The first contact region 16A includes a p-type impurity, such as aluminum or the like, for example, and has the p-type conductivity. The first contact region 16A forms the first principal surface 1. The first contact region 16A penetrates the source region 13, and makes contact with the body region 12.

A plurality of gate trenches 5 are provided in the first principal surface 1. The gate trench 5 extends in the X1-X2 direction, and the plurality of gate trenches 5 are arranged side by side in the Y1-Y2 direction. The gate trench 5 has a bottom surface 4 formed of the drift region 11. The gate trench 5 has a side surface 3 that penetrates the source region 13 and the body region 12, and the side surface 3 extends and connects to the bottom surface 4. The bottom surface 4 is included in a plane parallel to the second principal surface 2. An angle of the side surface 3 with respect to the plane including the bottom surface 4 is 50° or greater and 65° or less, for example. This angle may be 55° or greater, for example. This angle may be 60° or less, for example. The side surface 3 preferably has a {0-33-8} plane. The {0-33-8} plane is a crystal plane that can obtain an excellent mobility. The angle of the side surface 3 with respect to the plane including the bottom surface 4 may be 90°.

The first buried region 15A includes a p-type impurity, such as aluminum or the like, for example, and has the p-type conductivity. The first buried region 15A is located at a position nearer to the second principal surface 2 (nearer to the Z2-side) than the first contact region 16A is to the second principal surface 2. The first contact region 16A is located at a position nearer to first principal surface 1 (nearer to the Z1-side) than the first buried region 15A is to the first principal surface 1. The first buried region 15A makes contact with first contact region 16A. The first buried region 15A is formed at a position deeper than the gate trench 5. An upper end surface of the first buried region 15A is located at a position nearer to the second principal surface 2 (nearer to the Z2-side) than the bottom surface 4 of the gate trench 5 is to the second principal surface 2.

The second contact region 16B includes a p-type impurity, such as aluminum or the like, for example, and has p-type conductivity. The second contact region 16B forms the first principal surface 1. The second contact region 16B is formed in an annular shape in the plan view. The second contact region 16B is formed from the edge portion of the active region 6 to the termination region 7. A depth of the second contact region 163 may be equal to a depth of the first contact region 16A.

The second buried region 15B includes a p-type impurity, such as aluminum or the like, for example, and has p-type conductivity. The second buried region 15B is formed in an annular shape in plan view. The second buried region 15B is located at a position nearer to second principal surface 2 (nearer to the Z2-side) than the second contact region 16B is to the second principal surface 2. The second contact region 16B is located at a position nearer to first principal surface 1 (nearer to the Z1-side) than the second buried region 15B is to the first principal surface 1. The second buried region 15B makes contact with second contact region 16B. The second buried region 15B is formed at a position deeper than the gate trench 5. An upper end surface of the second buried region 15B is located at a position nearer to the second principal surface 2 (nearer to the Z2-side) than the bottom surface 4 of the gate trench 5 is to the second principal surface 2. The depth of the second buried region 15B may be equal to the depth of the first buried region 15A.

The buried region 17 makes contact with the second buried region 15B in a direction parallel to the first principal surface 1. The buried JTE region 17 is formed in an annular shape in the plan view. The buried JTE region 17 includes a p-type impurity, such as aluminum or the like, for example, and has the p-type conductivity. The buried JTE region 17 is separated from the first principal surface 1 and the second principal surface 2. A portion of an upper end surface of the buried JTE region 17 makes contact with a lower end surface of the second contact region 16B.

The surface JTE region 18 makes contact with the second contact region 16B in a direction parallel to the first principal surface 1. The surface JTE region 18 is formed in an annular shape in the plan view. The surface JTE region 18 includes a p-type impurity, such as aluminum or the like, for example, and has the p-type conductivity. The surface JTE region 18 is provided above the buried JTE region 17. The surface JTE region 18 is separated from the buried JTE region 17. The surface JTE region 18 is located at a position nearer to the first principal surface 1 (nearer to the Z1-side) than the buried JTE region 17 is to the first principal surface 1. The buried JTE region 17 is located at a position nearer to the second principal surface 2 (nearer to the Z2-side) than the surface JTE region 18 is to the second principal surface 2. The surface JTE region 18 forms the first principal surface 1. A part of the drift region 11 is located between the surface JTE region 18 and the buried JTE region 17. For example, a p-type impurity concentration of the surface JTE region 18 is lower than the p-type impurity concentration of the second contact region 16B.

The gate insulating film 81 is provided to make contact with the side surface 3 and the bottom surface 4. The gate insulating film 81 is an oxide film, for example. The gate insulating film 81 is composed of a material including silicon dioxide, for example. The gate insulating film 81 makes contact with the drift region 11 at the bottom surface 4. The gate insulating film 81 makes contact with each of the source region 13, the body region 12, and the drift region 11 at the side surface 3. The gate insulating film 81 may make contact with the source region 13 at the first principal surface 1.

The gate electrode 82 is provided on the gate insulating film 81. The gate electrode 82 is composed of polysilicon (poly-Si) including conductive impurity, for example. The gate electrode 82 is disposed inside the gate trench 5.

The gate insulating film 81 is also provided on the second contact region 16B in a region outside the region where the plurality of unit cells 8 are provided in the active region 6. Further, in this region, a gate contact part 113 is provided on the gate insulating film 81. The gate contact part 113 is a part of the gate electrode 82.

The interlayer insulator film 20 is provided to make contact with the gate electrode 82 and the gate insulating film 81. The interlayer insulator film 20 is composed of a material including silicon dioxide, for example. First contact holes 21 for the gate are formed in the interlayer insulator film 20. The gate contact part 113 is exposed from the interlayer insulator film 20 through the first contact hole 21. Second contact holes 22 for the source are formed in the interlayer insulator film 20 and the gate insulating film 81 at constant intervals in the Y1-Y2 direction. The second contact holes 22 are formed in the region where the plurality of unit cells 8 are provided. The second contact holes 22 are provided so that the gate trench 5 is positioned between the second contact holes 22 that are adjacent to each other in the Y1-Y2 direction. The second contact holes 22 extend in the X1-X2 direction.

The source region 13 and the first contact region 16A are exposed from the interlayer insulator film 20 and the gate insulating film 81 through the second contact holes 22.

The source electrodes 60 are provided inside the second contact holes 22, and make contact with the first principal surface 1. The source electrodes 60 make contact with the source regions 13 and the first contact regions 16A at the first principal surface 1. The source electrode 60 is composed of a material including nickel silicide (NiSi), for example. The source electrode 60 may be composed of a material including titanium (Ti), aluminum, and silicon. The source electrode 60 makes ohmic contact with the source region 13 and the first contact region 16A. That is, the source electrode 60 is connected to the silicon carbide substrate 10 through the second contact hole 22.

The gate pad 110 is provided on the interlayer insulator film 20, and makes contact with the gate contact part 113 through the first contact hole 21. The gate pad 110 is composed of a material including aluminum, or aluminum alloy, or copper (Cu), or copper alloy, for example. The gate pad 110 may be composed of a material including aluminum and copper. A barrier metal film, such as a titanium nitride (TiN) film or the like, may be provided between the gate pad 110 and the interlayer insulator film 20. The gate pad 110 is electrically connected to all of the gate electrodes 82 through the gate contact parts 113.

The source pad 120 is provided on the interlayer insulator film 20, and makes contact with the source electrode 60 that makes contact with the source region 13 and the first contact region 16A at the first principal surface 1 through the second contact hole 22. The source pad 120 is composed of a material including aluminum, aluminum alloy, copper, or copper alloy, for example. The source pad 120 is electrically insulated from the gate electrode 82 by the interlayer insulator film 20. The source pad 120 may be composed of a material including aluminum and copper. A barrier metal film, such as a titanium nitride (TIN) film or the like, may be provided between the source pad 120 and the interlayer insulator film 20. The source pad 120 may have a surface formed with concavo-convexes reflecting the presence of the second contact holes 22.

The first passivation film 210 is formed on the gate pad 110 and the source pad 120. The first passivation film 210 is an inorganic film, such as a silicon nitride film or the like, for example. The first passivation film 210 has a first interlayer insulation 211 between the gate pad 110 and the source pad 120. The first passivation film 210 has a first opening 212 exposing the gate pad 110, and a second opening 213 exposing the source pad 120. The first opening 212 has a first edge 214, and the second opening 213 has a second edge 215. The first opening 212 and the second opening 213 have a rectangular shape in the plan view viewed in the direction perpendicular to the first principal surface 1.

The first plating film 112 is formed on the gate pad 110 inside the first opening 212. The first plating film 112 includes a nickel (Ni) plating film, a palladium (Pd) plating film, and a gold (Au) plating film, for example. The Ni plating film is formed on the gate pad 110, and includes phosphorus (P). The Pd plating film is formed on the Ni plating film. The Au plating film is formed on the Pd plating film.

The second plating film 122 is formed on the source pad 120 inside the second opening 213. The second plating film 122 includes a nickel plating film, a palladium plating film, and a gold plating film, for example. The Ni plating film is formed on the source pad 120, and includes phosphorus. The Pd plating film is formed on the Ni plating film. The Au plating film is formed on the Pd plating film.

The second passivation film 220 is formed on the first passivation film 210, the first plating film 112, and the second plating film 122. The second passivation film 220 is an organic film, such as a polyimide film or the like, for example. The second passivation film 220 has a second interlayer insulation 221 covering the first interlayer insulation 211. The second passivation film 220 has a third opening 222 exposing the first plating film 112, and a fourth opening 223 exposing the second plating film 122. The third opening 222 has a third edge 224, and the fourth opening 223 has a fourth edge 225. The third opening 222 and fourth opening 223 have a rectangular shape in the plan view viewed in the direction perpendicular to first principal surface 1. In the plan view viewed in the direction perpendicular to first principal surface 1, the first edge 214 is located outside the third edge 224, and the second edge 215 is located outside the fourth edge 225.

The termination region 7 is covered with both the first passivation film 210 and the second passivation film 220. The first passivation film 210 is formed so as to expose a peripheral portion of the first principal surface 1. The second passivation film 220 covers the first passivation film 210 from above and from the side, and makes contact with the first principal surface 1 on the outer side of the first passivation film 210.

Next, operations and effects of the silicon carbide semiconductor device 100 according to the present embodiment will be described.

In the silicon carbide semiconductor device 100 according to the present embodiment, in the plan view viewed in the direction perpendicular to first principal surface 1, the first edge 214 of the first opening 212 is located outside the third edge 224 of the third opening 222, and the second edge 215 of the second opening 213 is located outside the fourth edge 225 of the fourth opening 223. For this reason, even if the first plating film 112 and the second plating film 122 are formed wide in the plane (XY-plane) parallel to the first principal surface 1, melted solder is less likely to reach the gate pad 110 when a metal plate is connected to the source pad 120 using the solder. Accordingly, it is possible to reduce an electrical connection between the source pad 120 and the gate pad 110 through the solder. Hence, heat is easily released from the silicon carbide substrate 10 in the direction in which the first principal surface 1 is located, through the first plating film 112 and the second plating film 122, and migration of the source pad 120 caused by the generated heat generation can be reduced. A bonding wire may be connected to the source pad 120.

In addition, because the termination region 7 is covered with both the first passivation film 210 and the second passivation film 220, the termination region 7 has an excellent moisture resistance, thereby making it possible to obtain an excellent reliability. In particular, because the second passivation film 220 covers the first passivation film 210 from above and the side, and the second passivation film 220 makes contact with the first principal surface 1 on the outer side of the first passivation film 210, an excellent moisture resistance can be obtained even with respect to the moisture entering from the side.

Moreover, in the case where the first passivation film 210 is an inorganic film and the second passivation film 220 is an organic film, an excellent moisture resistance can be obtained by the first passivation film 210 and an excellent flexibility can be obtained by the second passivation film 220.

In the plan view viewed in the direction perpendicular to first principal surface 1, a first distance L1 between a first end 121 of the source pad 120 nearest to gate pad 110 and the second edge 215 is preferably less than or equal to 80% of a second distance L2 between the first end 121 and the fourth edge 225. This is because the second plating film 122 can easily be formed wide and the migration of the source pad 120 caused by the generated heat can easily be reduced. The first distance L1 is more preferably less than or equal to 60% of the second distance L2, and still more preferably less than or equal to 40% of the second distance L2.

A side surface of the source pad 120 near the gate pad 110, an inner wall surface of the second opening 213, and an inner wall surface of the fourth opening 223 may be perpendicular to the first principal surface 1, or may not be perpendicular to the first principal surface 1. In a case where the side surface of source pad 120 near the gate pad 110 is not perpendicular to the first principal surface 1, the first end 121 in the plan view refers to a portion of the side surface of source pad 120 near the gate pad 110, that is farthest from the gate pad 110. In a case where the inner wall surface of the second opening 213 is not perpendicular to the first principal surface 1, the second edge 215 in the plan view refers to a portion of the inner wall surface of the second opening 213, that is farthest from the gate pad 110. In a case where the inner wall surface of the fourth opening 223 is not perpendicular to the first principal surface 1, the fourth edge 225 in the plan view refers to a portion of the inner wall surface of the fourth opening 223, that is farthest from the gate pad 110.

In addition, the first distance L1 is preferably less than or equal to 30 μm. This is because the second plating film 122 can easily be formed wide, and the migration of the source pad 120 caused by the generated heat can easily be reduced. The first distance L1 is more preferably less than or equal to 25 μm, and still more preferably less than or equal to 20 μm.

In the plan view viewed in the direction perpendicular to the first principal surface 1, the second edge 215 is preferably separated from all of the unit cells 8. That is, the first passivation film 210 does not overlap the unit cells 8 in the plan view viewed in the direction perpendicular to the first principal surface 1. This is because the heat generated in each unit cell 8 is easily transferred to the source pad 120, and the heat is less likely to be trapped inside the silicon carbide semiconductor device 100, so that the migration of the source pad 120 caused by the generated heat can easily be reduced.

Figure 5:
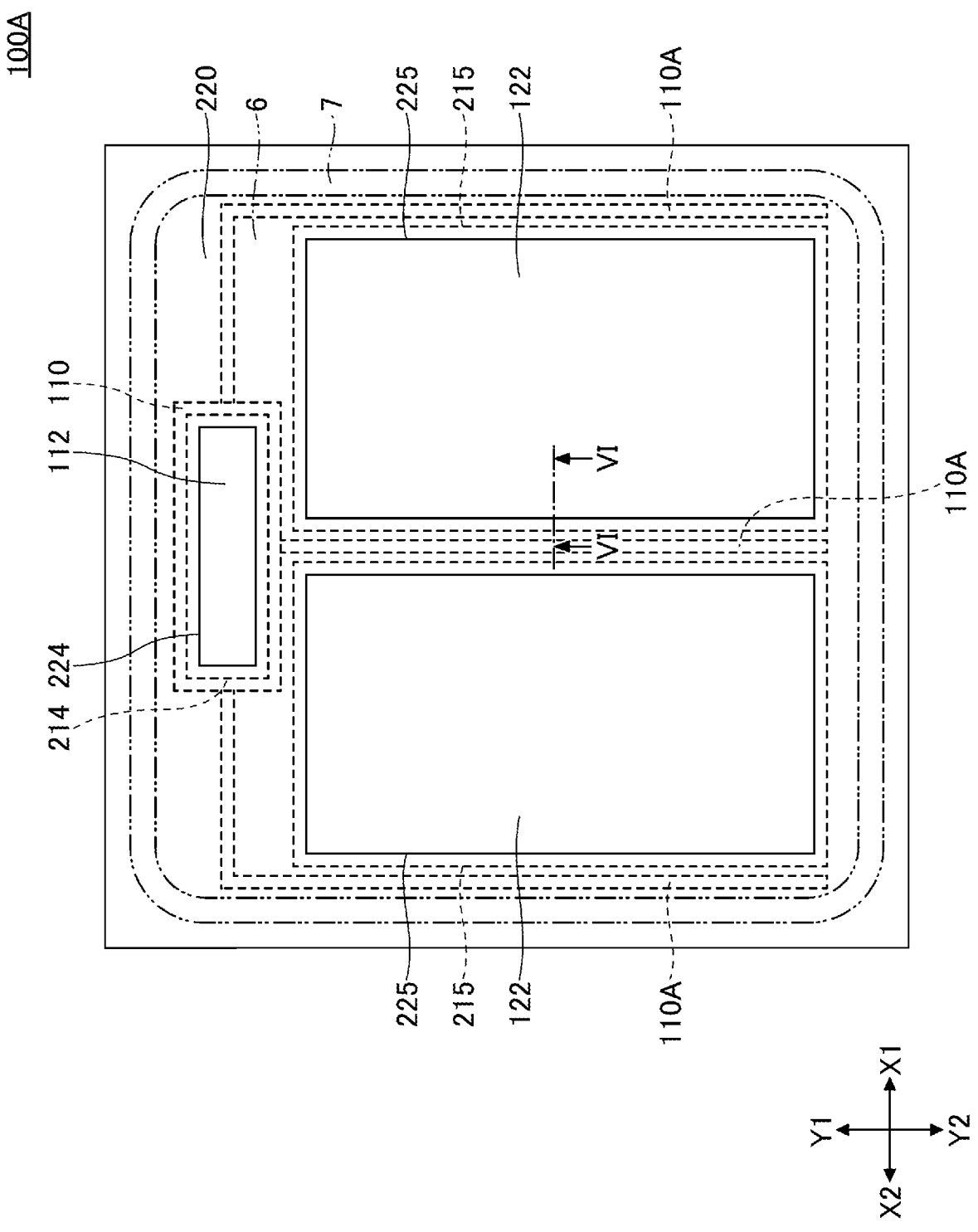
FIG. 5 is a top view illustrating the silicon carbide semiconductor device according to a modification of the embodiment.
Figure 6:
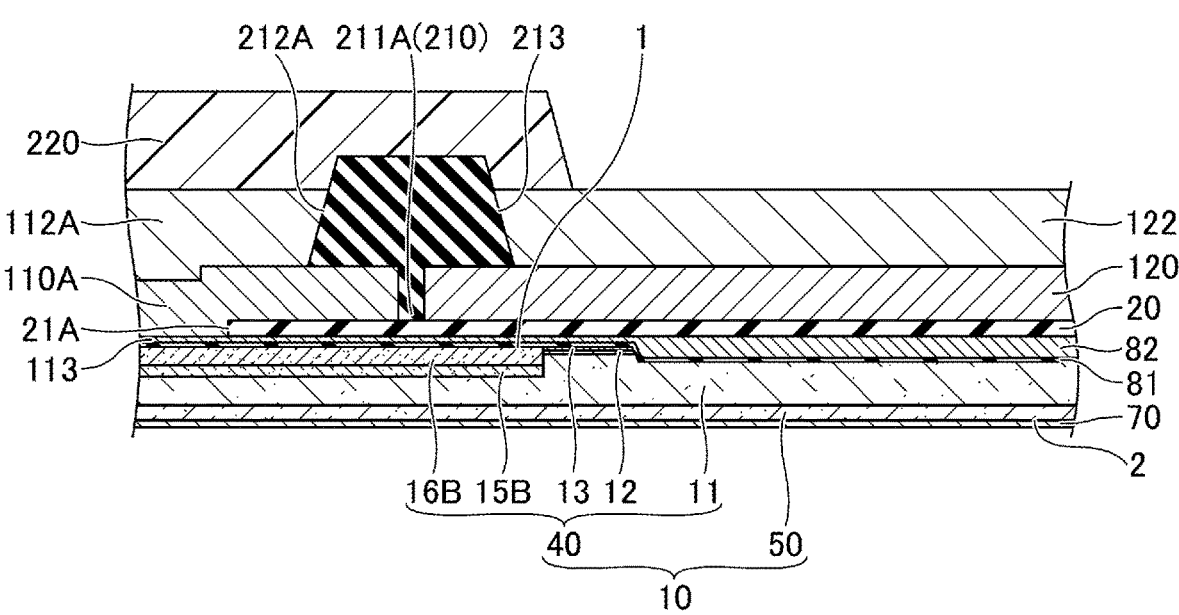
FIG. 6 is a cross sectional view illustrating the silicon carbide semiconductor device according to the modification of the embodiment.
Figure 6:
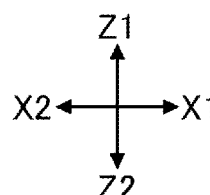

A gate runner may be connected to the gate pad 110, and a plating film may be formed on the gate runner. FIG. 5 is a top view illustrating the silicon carbide semiconductor device according to a modification of the embodiment. FIG. 6 is a cross sectional view illustrating the silicon carbide semiconductor device according to the modification of the embodiment. FIG. 6 corresponds to a cross sectional view taken along a line VI-VI in FIG. 5.

As illustrated in FIG. 5, a silicon carbide semiconductor device 100A according to the modification of the embodiment has three gate runners 110A connected to the gate pad 110. The gate runner 110A has a portion extending in the Y1-Y2 direction. The source pad 120 is provided between two gate runners 110A that are adjacent to each other in the X1-X2 direction.

As illustrated in FIG. 6, a third contact hole 21A for the gate runner 110A is formed in the interlayer insulator film 20, in addition to the first contact hole 21. The gate contact part 113 is exposed from the interlayer insulator film 20 through the third contact hole 21A.

The first passivation film 210 includes a third interlayer insulation 211A between the gate runner 110A and the source pad 120, in addition to the first interlayer insulation 211. The first passivation film 210 has a fifth opening 212A exposing the gate runner 110A, in addition to the first opening 212 and the second opening 213. The silicon carbide semiconductor device 100A has a third plating film 112A formed on the gate runner 110A inside the fifth opening 212A. The third plating film 112A includes a nickel plating film, a palladium plating film, and a gold plating film, for example. The Ni plating film is formed on the gate runner 110A, and includes phosphorus. The Pd plating film is formed on the Ni plating film. The Au plating film is formed on the Pd plating film. The third plating film 112A is covered with the second passivation film 220.

Other configurations of the modification are the same as those of the embodiment.

The silicon carbide semiconductor device 100A according to the modification can also obtain the same effects as the first embodiment. In addition, because the heat is transferred through the third plating film 112A, the temperature uniformity inside the silicon carbide semiconductor device 100A can be improved.

Although the embodiments are described above in detail, the present disclosure is not limited to a specific embodiment, and various variations and modifications can be made without departing from the scope described in the claims.

DESCRIPTION OF REFERENCE NUMERALS

1: First principal surface
2: Second principal surface
3: Side surface

4: Bottom surface
5: Gate trench
6: Active region
7: Termination region
8: Unit cell
10: Silicon carbide substrate
11: Drift region
12: Body region
13: Source region
15A: First buried region
15B: Second buried region
16A: First contact region
16B: Second contact region
17: Buried JTE region
18: Surface JTE region
20: Interlayer insulator film
21: First contact hole
21A: Third contact hole
22: Second contact hole
40: Silicon carbide epitaxial layer
50: Silicon carbide single crystal substrate
60: Source electrode
70: Drain electrode
81: Gate insulating film
82: Gate electrode
100, 100A: Silicon carbide semiconductor device
110: Gate pad
110A: Gate runner
112: First plating film
112A: Third plating film
113: Gate contact part
120: Source pad
121: First end
122: Second plating film
210: First passivation film
211: First interlayer insulation
211A: Third interlayer insulation
212: First opening
212A: Fifth opening
213: Second opening
214: First edge
215: Second edge
220: Second passivation film
221: Second interlayer insulation
222: Third opening
223: Fourth opening
224: Third edge
225: Fourth edge

The invention claimed is:

1. A silicon carbide semiconductor device comprising:
a silicon carbide substrate having a first principal surface;
a gate pad and a source pad formed on the first principal surface;
a first passivation film formed on the gate pad and the source pad; and
a second passivation film formed on the first passivation film, wherein the first passivation film includes a first interlayer insulation between the gate pad and the source pad, a first opening exposing the gate pad and having a first edge, and a second opening exposing the source pad and having a second edge;
a first plating film formed on the gate pad inside the first opening; and
a second plating film formed on the source pad inside the second opening, wherein
the second passivation film is also formed on the first plating film and the second plating film,
the second passivation film includes a second interlayer insulation covering the first interlayer insulation, a third opening exposing the first plating film and having a third edge, and a fourth opening exposing the second plating film and having a fourth edge, and
in a plan view viewed in a direction perpendicular to the first principal surface, the first edge is outside the third edge, and the second edge is outside the fourth edge.

2. The silicon carbide semiconductor device as claimed in claim 1, wherein in the plan view viewed in the direction perpendicular to the first principal surface, a first distance between a first end of the source pad nearest to the gate pad and the second edge is less than or equal to 80% of a second distance between the first end and the fourth edge.

3. The silicon carbide semiconductor device as claimed in claim 2, wherein the first distance is less than or equal to 60% of the second distance.

4. The silicon carbide semiconductor device as claimed in claim 3, wherein the first distance is less than or equal to 40% of the second distance.

5. The silicon carbide semiconductor device as claimed in claim 1, wherein in the plan view viewed in the direction perpendicular to the first principal surface, a first distance between a first end of the source pad nearest to the gate pad and the second edge is less than or equal to 30 μm.

6. The silicon carbide semiconductor device as claimed in claim 1, wherein the silicon carbide substrate includes:
an active region including a plurality of unit cells; and
a termination region provided in a perimeter around the active region,
wherein in the plan view viewed in the direction perpendicular to the first principal surface, the second edge is separated from the plurality of unit cells.

7. The silicon carbide semiconductor device as claimed in claim 1, wherein the silicon carbide substrate includes:
an active region including a plurality of unit cells; and
a termination region provided in a perimeter around the active region,
wherein the termination region is covered with both the first passivation film and the second passivation film.

8. The silicon carbide semiconductor device as claimed in claim 1, wherein
the first passivation film is an inorganic film, and
the second passivation film is an organic film.

* * * * *